United States Patent [19]

LaForce et al.

[11] Patent Number: 5,075,191

[45] Date of Patent: Dec. 24, 1991

[54] PROCESS FOR CONTROLLING ALLOY FRACTIONATION

[75] Inventors: Roger W. LaForce, Fairport; Lawrence E. Kowalczyk, Penfield; Santokh S. Badesha, Pittsford; Paul F. Zukoski, Henrietta; Monroe J. Hordon, Pittsford; Steven M. Sterling, Walworth; Barry A. Lees, Fairport; Fred A. Elder, Webster, all of N.Y.

[73] Assignee: Xerox Corporation, Stamford, Conn.

[21] Appl. No.: 546,996

[22] Filed: Jul. 2, 1990

[51] Int. Cl.$^5$ .................. G03G 5/082; C21D 1/00
[52] U.S. Cl. .................. 430/128; 430/135; 420/579; 148/243; 148/284
[58] Field of Search ........... 430/128, 135; 420/579; 148/243, 284

[56] References Cited

U.S. PATENT DOCUMENTS

| | | | |
|---|---|---|---|
| 4,780,386 | 10/1988 | Hordon et al. | 430/58 |
| 4,822,712 | 4/1989 | Foley et al. | 430/128 |
| 4,842,973 | 6/1989 | Badesha et al. | 430/128 |
| 4,859,411 | 8/1989 | Sweatman et al. | 419/23 |
| 4,894,307 | 1/1990 | Badesha et al. | 430/128 |

FOREIGN PATENT DOCUMENTS 126539  7/1984  Japan .................. 430/128

Primary Examiner—Roland Martin
Attorney, Agent, or Firm—Judith L. Byorick

[57] ABSTRACT

Disclosed is a process for treating particles of selenium alloy to reduce fractionation when the particles are subsequently vacuum evaporated onto a substrate which comprises (1) heating particles of an alloy of selenium and an alloying component selected from the group are exposed to oxygen; (2) exposing the particles to water vapor; and (3) subjecting the particles previously exposed to oxygen and water vapor to a vacuum. Also disclosed is a process which comprises (1) providing particles of an alloy of selenium and an alloying component selected from the group consisting of tellurium, arsenic, and mixtures thereof; (2) forming selenium oxide on the surfaces of the particles; (3) converting the selenium oxide on the particle surfaces to selenious acid; and (4) removing the selenious acid from the particle surfaces.

19 Claims, No Drawings

PROCESS FOR CONTROLLING ALLOY FRACTIONATION

BACKGROUND OF THE INVENTION

The present invention relates in general to the treatment of selenium alloy particles prior to vapor deposition of the selenium alloy on a substrate and using the treated selenium alloy particles in a process to vapor deposit a selenium alloy layer onto a substrate to form electrophotographic imaging members. One embodiment of the present invention is directed to a process which comprises (1) heating particles of an alloy of selenium and an alloying component selected from the group consisting of tellurium, arsenic, and mixtures thereof while said particles are exposed to oxygen; (2) exposing the particles to water; and (3) subjecting the particles previously exposed to oxygen and water to a vacuum. Another embodiment of the present invention is directed to a process which comprises (1) providing particles of an alloy of selenium and an alloying component selected from the group consisting of tellurium, arsenic, and mixtures thereof; (2) forming selenium oxide on the surfaces of the particles; (3) converting the selenium oxide on the particle surfaces to selenious acid; and (4) removing the selenious acid from the particle surfaces. The present invention enables reduced fractionation of selenium and other alloying components during vacuum evaporation of selenium alloy particles that have been subjected to the process.

The formation and development of images on the imaging surfaces of electrophotographic imaging members by electrostatic means is well known. One of the most widely used processes is xerography, described in, for example, U.S. Pat. No. 2,297,691 to Chester Carlson. Numerous different types of electrophotographic imaging members for xerography, i.e. photoreceptors, can be used in the electrophotographic imaging process. Such electrophotographic imaging members can include inorganic materials, organic materials, and mixtures thereof. Electrophotographic imaging members can comprise contiguous layers in which at least one of the layers performs a charge generation function and another layer forms a charge carrier transport function, or can comprise a single layer which performs both the generation and transport functions. These electrophotographic imaging members can also be coated with a protective overcoating to improve wear.

Electrophotographic imaging members based on amorphous selenium have been modified to improve panchromatic response, increase speed and to improve color copyability. These devices are typically based on alloys of selenium with tellurium and/or arsenic. The selenium electrophotographic imaging members can be fabricated as single layer devices comprising a selenium-tellurium, selenium-arsenic, or selenium-tellurium-arsenic alloy layer which performs both charge generation and charge transport functions. The selenium electrophotographic imaging members can also comprise multiple layers such as, for example, a selenium alloy transport layer and a contiguous selenium alloy generator layer.

A common technique for manufacturing photoreceptor plates involves vacuum deposition of a selenium alloy to form an electrophotographic imaging layer on a substrate. Tellurium is incorporated as an additive for the purpose of enhancing the spectral sensitivity of the photoconductor. Arsenic is incorporated as an additive for the purpose of improving wear characteristics, passivating against crystallization, and improving electricals. Typically, the tellurium addition is incorporated as a thin selenium-tellurium alloy layer deposited over a selenium alloy base layer in order to achieve the benefits of the photogeneration characteristics of SeTe with the beneficial transport characteristics of SeAs alloys. Fractionation of the tellurium and/or arsenic composition during evaporation results in a concentration gradient in the deposited selenium alloy layer during vacuum evaporation. Thus, the term "fractionation" is used to describe inhomogeneities in the stoichiometry of vacuum deposited alloy thin films. Fractionation occurs as a result of differences in the partial vapor pressure of the molecular species present over the solid and liquid phases of binary, tenary and other multicomponent alloys. Alloy fractionation is a generic problem with chalcogenide alloys. A key element in the fabrication of doped photoreceptors is the control of fractionation of alloy components such as tellurium and/or arsenic during the evaporation of selenium alloy layers. Tellurium and/or arsenic fractionation control is particularly important because the local tellurium and/or arsenic concentration at the extreme top surface of the structure, denoted as top surface tellurium (TST) or top surface arsenic (TSA), directly affects xerographic sensitivity, charge acceptance, dark discharge, copy quality, photoreceptor wear and crystallization resistance. In single layer low arsenic selenium alloy photoreceptors, arsenic enrichment at the top surface due to fractionation can also cause severe reticulation of the evaporated film. In two layer or multilayer photoreceptors where low arsenic alloys may be incorporated as a base or transport layer, arsenic enrichment at the interface with the layer above can lead to severe residual cycle up problems. In single layer tellurium selenium alloy photoreceptors, tellurium enrichment at the top surface due to fractionation can cause undue sensitivity enhancement, poor charge acceptance and enhancement of dark discharge. In two layer or multilayer photoreceptors where tellurium alloys may be incorporated as a generator layer, tellurium enrichment at the upper surface of the tellurium alloy layer can result in similar undue sensitivity enhancement, poor charge acceptance, and enhancement of dark discharge.

One method of preparing selenium alloys for evaporation is to grind selenium alloy shot (beads) and compress the ground material into pellet agglomerates, typically 150 to 300 milligrams in weight and having an average diameter of about 6 millimeters (6,000 microns). The pellets are evaporated from crucibles in a vacuum coater using a time/temperature crucible designed to minimize the fractionation of the alloy during evaporation.

One shortcoming of a vacuum deposited selenium-tellurium alloy layer in a photoreceptor structure is the propensity of the selenium-tellurium alloy at the surface of the layer to crystallize under thermal exposure in machine service. To retard premature crystallization and extend photoreceptor life, the addition of up to about 5 percent arsenic to the selenium-tellurium alloy has been found beneficial without impairment of xerographic performance. It was found that the addition of arsenic to the composition employed to prepare the pellet impaired the capability of the process to control tellurium fractionation. Selenium-tellurium-arsenic pellets produced by the pelletizing process exhibited a wider variability of top surface tellurium concentrations compared to selenium-tellurium pellets. This wider variability of top surface tellurium concentrations was manifested by a correspondingly wider distribution of photoreceptor sensitivity values than the top surface tellurium concentration variations in the selenium-tellurium alloy pellets. In an extended photoreceptor fabrication run, up to 50 percent of the selenium-tellurium-arsenic pellets were rejected for forming high top surface tellurium concentrations which caused excessive sensitivity in the final photoreceptor.

In deposited layers of alloys of Se-Te, the normal percentages of top surface tellurium can cause excessively high photosensitivity. This photosensitivity is variable and changes as the surface of the layer wears away. Surface injection of corona deposited charge and thermally enhanced bulk dark decay involving carrier generation cause the toner images in the final copies to exhibit a washed out, low density appearance. Excessive dark decay causes loss of high density in solid areas of toner images and general loss of image density.

In three layered photoreceptors containing, for example, a base layer of selenium doped with arsenic and chlorine, a generator layer of selenium doped with tellurium and a top layer of selenium doped with arsenic, there is a susceptibility to changes in the Te concentration profile through the thickness of the Se-Te alloy layer due to Te diffusion. The diffusion rate is a function of the concentration of Te. Higher concentrations of Te diffuse at a higher rate. Such diffusion causes changes in the electrical properties as the concentration of Te changes. The diffusion occurs from the middle layer into the adjacent layers. Diffusion is a greater problem in alloys of Se-Te compared to alloys of Se-Te-As because some crosslinking occurs in the latter alloy.

For alloys of Se-As, a sufficiently high concentration of top surface arsenic causes reticulation of the surface of the deposited alloy layer. This occurs as the deposited surface cools down and the differential thermal contraction through the thickness of the layer causes the surface to wrinkle. The deposited layer also exhibits electrical instability with excessive dark decay under certain conditions. When the photoreceptor comprises a single layer Se-As alloy, about 1 to about 2.5 percent by weight arsenic, based on the weight of the entire layer, at the surface of an alloy layer provides protection against surface crystallization. When the concentration of arsenic is greater than about 2.5 percent by weight, reticulation or electrical instability risks become higher. However, the shift in photosensitivity is not large.

In the past, shutters have been used over crucibles to control fractionation. These shutters are closed near the end of the evaporation cycle. The tellurium or arsenic rich material arising from the crucible deposits on the shutter rather than on the photoreceptor. However, in planetary coating systems, installation of shutters is complex, difficult and expensive. Further, after one or more coating runs, it is necessary to clean the surface of the shutters and the resulting debris can cause defects to occur in subsequently formed photoreceptor layers.

Thus, a significant problem encountered in the fabrication of selenium alloy photoreceptors is the fractionation or preferential evaporation of a species such that the resulting film composition does not replicate the original composition. In other words, the deposited film or layer does not have a uniform composition extending from one surface to the other. For example, when tellurium is the dopant, the tellurium concentration is unduly high at the top surface and approaches zero at the bottom of the vacuum deposited layer. This problem is also observed for alloys of Se-Te, Se-As, Se-As-Te, Se-As-Te-Cl, and the like and mixtures thereof.

U.S. Pat. No. 4,780,386 (Hordon et al.), the disclosure of which is totally incorporated herein by reference, discloses a process in which the surfaces of large particles of an alloy comprising selenium, tellurium and arsenic having an average particle size of at least 300 microns and an average weight of less than about 1,000 milligrams are mechanically abraded while maintaining the substantial surface integrity of the large particles to form between about 3 percent by weight to about 20 percent by weight dust particles of the alloy based on the total weight of the alloy prior to mechanical abrasion. The alloy dust particles are substantially uniformly compacted around the outer periphery of the large particles of the alloy. The large particles of the alloy may be beads of the alloy having an average particle size of between about 300 microns and about 3,000 microns or pellets having an average weight between about 50 milligrams and about 1,000 milligrams, the pellets comprising compressed finely ground particles of the alloy having an average particle size of less than about 200 microns prior to compression. In one preferred embodiment, the process comprises mechanically abrading the surfaces of beads of an alloy comprising selenium, tellurium and arsenic having an average particle size of between about 300 microns and about 3,000 microns while maintaining the substantial surface integrity of the beads to form a minor amount of dust particles of the alloy, grinding the beads and the dust particles to form finely ground particles of the alloy, and compressing the ground particles into pellets having an average weight between about 50 milligrams and about 1,000 milligrams. In another embodiment, mechanical abrasion of the surface of the pellets after the pelletizing step may be substituted for mechanical abrasion of the beads. The process includes providing beads of an alloy comprising selenium, tellurium and arsenic having an average particle size of between about 300 microns and about 3,000 microns, grinding the beads to form finely ground particles of the alloy having an average particle size of less than about 200 microns, compressing the ground particles into pellets having an average weight between about 50 milligrams and about 1,000 milligrams, and mechanically abrading the surface of the pellets to form alloy dust particles while maintaining the substantial surface integrity of the pellets. If desired, the process may include both the steps of mechanically abrading the surface of the beads and mechanically abrading the surface of the pellets. The selenium-tellurium-arsenic alloy in the pellets may then be vacuum deposited to form a photoconductive layer of an electrophotographic imaging member which comprises a substrate and, optionally, one or more other layers.

U.S. Pat. No. 4,822,712 (Foley et al.), the disclosure of which is totally incorporated herein by reference, discloses a process for controlling fractionation by crystallizing particles of an alloy of selenium which comprises providing particles of an alloy comprising amorphous selenium and an alloying component selected from the group consisting of tellurium, arsenic, and mixtures thereof, said particles having an average size of at least about 300 micrometers and an average weight of less than about 1,000 milligrams, forming crystal nucleation sites on at least the surface of the particles while maintaining the substantial integrity of the particles, heating the particles to at least a first temperature between about 50° C. and about 80° C. for at least about 30 minutes to form a thin, substantially continuous layer of crystalline material at the surface of the particles while maintaining the core of selenium alloy in the particles in an amorphous state, and rapidly heating the particles to at least a second temperature below the softening temperature of the particles, the second temperature being at least 20° C. higher than the first temperature and between about 85° C. and about 130° C. to crystallize at least about 5 percent by weight of the amorphous core of selenium alloy in the particles.

U.S. Pat. No. 4,842,973 (Badesha et al.), the disclosure of which is totally incorporated herein by reference, discloses a process for fabricating an electrophotographic imaging member which comprises providing in a vacuum chamber at least one crucible containing particles of an alloy comprising selenium and an alloying component selected from the group consisting of tellurium, arsenic, and mixtures thereof, providing a substrate in the vacuum chamber, applying a partial vacuum to the vacuum chamber, and rapidly heating the crucible to a temperature between about 250° C. and 450° C. to deposit a thin continuous selenium alloy layer on the substrate. A plurality of selenium containing layers can be formed by providing in the vacuum chamber at least one first layer crucible containing particles of selenium or a selenium alloy, at least one second layer crucible containing particles of an alloy comprising selenium, and a substrate, applying a partial vacuum to the vacuum chamber, heating the particles in the first layer crucible to deposit a thin continuous selenium or selenium alloy first layer on the substrate, maintaining the particles in the second layer crucible at a first temperature below about 130° C. while the thin continuous selenium or selenium alloy first layer is being deposited on the substrate, and rapidly heating the particles in the second layer crucible to a second temperature between about 250° C. and about 450° C. to deposit a thin continuous selenium alloy second layer on the substrate.

U.S. Pat. No. 4,894,307 (Badesha et al.), the disclosure of which is totally incorporated herein by reference, discloses a process which comprises providing a chalcogenide alloy source material, crystallizing the source material, vacuum evaporating the source material, and adding in effective amounts thereto, prior to, during, or subsequent to evaporation, organic components such as siloxane polymers or greases, enabling the formation of a photoconductor with improved characteristics.

U.S. Pat. No. 4,859,411 (Sweatman et al.), the disclosure of which is totally incorporated herein by reference, discloses a process for crystallizing particles of an alloy of selenium which comprises providing pellets of an alloy comprising amorphous selenium and an alloying component selected from the group consisting of tellurium, arsenic, and mixtures thereof, said pellets having an average weight between about 50 milligrams and about 1,000 milligrams, exposing the pellets to an ambient temperature of between about 114° C. and about 190° C. until an exotherm occurs in the pellets at between about 104° C. and about 180° C., carrying the exotherm through to substantial completion, grinding the pellets into fresh powder having an average particle size of less than about 200 micrometers, and compressing the fresh powder into fresh pellets having an average weight between about 50 milligrams and about 1,000 milligrams.

U.S. Pat. No. 4,205,098 (Kobayashi et al.), the disclosure of which is totally incorporated herein by reference, discloses a process in which a powdery material of selenium alone or at least with one additive is compacted under pressure to produce tablets, the tablets being degassed by heating the tablets at an elevated temperature below the melting point of the metallic selenium and thereafter using the tablets as a source for vacuum deposition. The tablets formed by compacting the powdery selenium under pressure may be sintered at a temperature between about 100° C. and about 220° C. Typical examples of sintering conditions include 210° C. for between about 20 minutes and about 1 hour and about 1 to about 4 hours at 100° C. depending upon compression pressure. Additives mentioned include Te, As, Sb, Bi, Fe, Tl, S, I, F, Cl, Br, B, Ge, PbSe, CuO, Cd, Pb, $BiCl_3$, $SbS_3$, $Bi_2$, $S_3$, Zn, $CdS_2$, SeS and the like. In one example, tablets having a thickness of 2 mm and a diameter of 6 mm were sintered and degassed at about 210° C. for about 18 minutes.

U.S. Pat. No. 4,609,605 (Lees et al.), the disclosure of which is totally incorporated herein by reference, discloses a multilayered electrophotographic imaging member in which one of the layers may comprise a selenium-tellurium-arsenic alloy. The alloy can be prepared by grinding selenium-tellurium-arsenic alloy beads, with or without halogen doping, preparing pellets having an average diameter of about 6 mm from the ground material, and evaporating the pellets in crucibles in a vacuum coater.

U.S. Pat. No. 4,297,424 (Hewitt), the disclosure of which is totally incorporated herein by reference, discloses a process for preparing a photoreceptor wherein selenium-tellurium-arsenic alloy shot is ground, formed into pellets and vacuum evaporated.

U.S. Pat. No. 4,554,230 (Foley et al.), the disclosure of which is totally incorporated herein by reference, discloses a method for fabricating a photoreceptor wherein selenium-arsenic alloy beads are ground, formed into pellets and vacuum evaporated.

U.S. Pat. No. 4,205,098 (Kobayashi et al), the disclosure of which is totally incorporated herein by reference, discloses a method for producing selenium pellets wherein selenium or selenium and additives are formed into powder and then compacted into pellets and vacuum evaporated. The additives may include tellurium and arsenic.

U.S. Pat. No. 3,524,754 (Cerlon et al.), the disclosure of which is totally incorporated herein by reference, discloses a process for preparing a photoreceptor wherein selenium-arsenic-antimony alloys are ground into fine particles and vacuum evaporated.

U.S. Pat. No. 4,710,442 (Koelling et al.), the disclosure of which is totally incorporated herein by reference, discloses an arsenic-selenium photoreceptor wherein the concentration of arsenic increases from the bottom surface to the top surface of the photoreceptor such that the arsenic concentration is about 5 weight percent at a depth of about 5 to 10 microns on the top surface of the photoreceptor and is about 30 to 40 weight percent at the top surface of the photoreceptor. The photoreceptor is prepared by heating a mixture of selenium-arsenic alloys in a vacuum in a step-wise manner such that the alloys are consequentially deposited on the substrate to form a photoconductive film with an increasing concentration of arsenic from the substrate interface to the top surface of the photoreceptor. In one specific embodiment, a mixture of three selenium-arsenic alloys are maintained at an intermediate temperature in the range of from about 100° to 130° C. for a period of time sufficient to dry the mixture. The alloy may also contain a halogen. In Example X, the drying step temperature was attained in about 2 minutes and maintained for a period of approximately 3 minutes.

U.S. Pat. No. 4,583,608 (Field et al.), the disclosure of which is totally incorporated herein by reference, discloses heat treatment of single crystal superalloy particles. In one embodiment, single crystal particles are heat treated by using a heat treatment cycle during the initial stages of which incipient melting occurs within the particles being treated. During a subsequent step in heat treatment process substantial diffusion occurs in the particle. In a related embodiment, single crystal articles which have previously undergone incipient melting during a heat treatment process are prepared by a heat treatment process. In still another embodiment, a single crystal composition of various elements including chromium and nickel is treated to heating steps at various temperatures. In column 3, lines 40 to 47, a stepped treatment cycle is employed in which an alloy is heated to a temperature below about 25° F. of an incipient melting temperature and held below the incipient melting temperature for a period of time sufficient to achieve a substantial amount of alloy homogenization.

U.S. Pat. No. 4,585,621 (Oda et al), the disclosure of which is totally incorporated herein by reference, discloses various selenium alloys, e.g., Se-Te and Se-As, containing phosphorous which are vacuum deposited on a substrate to form a photoreceptor.

U.S. Pat. No. 4,632,849 (Ogawa et al), the disclosure of which is totally incorporated herein by reference, discloses a method for making a fine powder of a metallic compound coated with ceramics. The process involves heating a gaseous mixture of at least methyl vapor and another element to a temperature not higher than 0.8 times as low as the melting point of the metal so that the metal and other element are reactive with each other while rapidly cooling to form a fine powder metallic compound. The metallic powder is further passed into another metal vapor to cover the metal powder with the other metal. The reaction system is cooled to a region in which the metal compound is kept stable to prevent further growth of the particles.

Swiss Patent Publication CH-656-486-A, published June 30, 1986, discloses production of PbTe, PbSn, PbSnTe, ZnTe, CdTe and CdHgTe by liquid phase epitaxy, the solvent for the telluride being a melt of arsenic telluride and/or antimony telluride.

Japanese Patent Publication J6 0172-346-A, published Sept. 5, 1985, discloses a process wherein TlSe are placed in a crucible and heated at 180° to 190° C., Mg is added to the melting alloy, the temperature is raised to the 200° to 220° C. and allowed to stand at this temperature to form a uniform alloy of TlMgSe. The alloy is used in electric field-releasing ion beam generators.

U.S. Pat. No. 4,484,945 (Badesha et al.), the disclosure of which is totally incorporated herein by reference, discloses a process for preparing chalcogenide alloys by providing a solution mixture of oxides of the desired chalcogens and subsequently subjecting this mixture to a simultaneous coreduction reaction. Generally the reduction reaction is accomplished at relatively low temperature, not exceeding about 120° C.

Japanese Patent Publication 57-1567 to Tokyo Shibaura Denki K.K., published June 7, 1982 discloses a process wherein an amorphous photoconductive material is obtained by combining selenium, arsenic, antimony and tellurium. This raises the glass transition point.

U.S. Pat. No. 4,414,179 (Robinette), the disclosure of which is totally incorporated herein by reference, discloses a process for preparing a selenium alloy comprising heating a mixture comprising selenium, arsenic and chlorine to a temperature between about 290° C. and about 330° C. to form a molten mixture, agitating the molten mixture to combine the components, continuing all agitation, raising the temperature of the mixture to at least 420° C. for at least about 30 minutes and cooling the mixture until it becomes a solid. This alloy may be vacuum deposited.

U.S. Pat. No. 4,015,029 (Elchiasak), the disclosure of which is totally incorporated herein by reference, discloses a selenium alloy evaporation technique for depositing photoconductive material onto a substrate. The technique involves incorporating 1 to 80% by weight of at least one nonvolatile infra red absorbing heat sink in or within the body of inorganic photoconductive material and thereafter heating the resulting mixture with infra red heat.

U.S. Pat. No. 3,785,806 (Henrickson), the disclosure of which is totally incorporated herein by reference, discloses a process for producing arsenic doped selenium by mixing finely divided selenium with finely divided arsenic in an atomic ratio of 1:4 and thereafter heating the mixture in an inert atmosphere to obtain a master alloy. The master alloy is then mixed with molten pure selenium to attain an arsenic content of between 0.1 and 2% by weight based on the selenium.

U.S. Pat. No. 3,911,091 (Karem et al.), the disclosure of which is totally incorporated herein by reference, discloses a method for fabricating a photoreceptor by incorporating trigonal selenium particles in an organic binder material.

U.S. Pat. No. 4,513,031, the disclosure of which is totally incorporated herein by reference, discloses a process for the formation of an alloy layer on the surface of a substrate which comprises forming in a vessel a molten bath comprising at least one vaporizable alloy component having a higher vapor pressure than at least one other vaporizable alloy component in the bath, forming a thin substantially inert liquid layer of an evaporation retarding film on the upper surface of the molten bath, the liquid layer of the evaporation retarding film having a lower or comparable vapor pressure than both the vaporizable alloying component having a higher vapor pressure and the other vaporizable alloying component, covaporizing at least a portion of both the vaporizable alloying component having a higher vapor pressure and the other vaporizable alloying component whereby the evaporation retarding film retards the initial evaporation of the vaporizable alloying component having a higher vapor pressure, and forming an alloy layer comprising both the vaporizable alloying component having a higher vapor pressure and the other vaporizable alloying component on the substrate. Examples of vaporizable alloying components include selenium-sulfur and the like, and examples of vaporizable alloying components having relatively low vapor pressures which include tellurium, arsenic, antimony, bismuth, and the like. Examples of suitable evaporation retarding film materials include long chain hydrocarbon oils, inert oils, greases or waxes at room temperature which flow readily at less than the temperature of detectable deposition of the vaporizable alloying components having higher vapor pressures in the alloying mixture. Examples of retarding materials include lanolin, silicone oils such as dimethylpolysiloxane, branched or linear polyolefins such as polypropylene wax and polyalpha olefin oils, and the like. According to the teachings of this patent, optimum results are achieved with high molecular weight long chain hydrocarbon oils and greases generally refined by molecular distillation to have a low vapor pressure at the alloy deposition temperature.

U.S. Pat. No. 4,770,965 (W. Fender et al.) discloses a process which includes heating an alloy comprising selenium and from about 0.05 percent to about 2 percent by weight arsenic until from about 2 percent to about 90 percent by weight of the selenium in the alloy is crystallized, vacuum depositing the alloy on a substrate to form a vitreous photoconductive insulating layer having a thickness of between about 100 microns and about 400 microns containing between about 0.3 percent and about 2 percent by weight arsenic at the surface of the photoconductive insulating layer facing away from the conductive substrate, and heating the photoconductive insulating layer until only the selenium in the layer adjacent the substrate crystallizes to form a continuous substantially uniform crystalline layer having a thickness up to about one micrometer. A thin protective overcoating layer is applied on the photoconductive insulating layer. The selenium-arsenic alloy may be at least partially crystallized by placing the selenium alloy in shot form in a crucible in a vacuum coater and heating to between about 93° C. (200° F.) and about 177° C. (350° F.) for between about 20 minutes and about one hour to increase crystallinity and avoid reticulation. Preferably, the selenium-arsenic alloy material in shot form is heated until from about 2 percent to about 90 percent by weight of the selenium in the alloy is crystallized. The selenium-arsenic alloy material shot may be crystallized completely prior to vacuum deposition to ensure that a uniform starting point is employed. However, if desired, a completely amorphous alloy may be used as the starting material for vacuum deposition. In Examples II and V of this patent, halogen doped selenium-arsenic alloy shot contained about 0.35 percent by weight arsenic, about 11.5 parts per million by weight chlorine, and the remainder selenium, based on the total weight of the alloy was heat aged at 121° C. (250° F.) for 1 hour in crucibles in a vacuum coater to crystallize the selenium in the alloy. After crystallization, the selenium alloy was evaporated from chrome coated stainless steel crucibles at an evaporation temperature of between about 204° C. (400° F.) and about 288° C. (550° F.).

U.S. Pat. No. 4,904,559 (Badesha et al.) discloses a process for the preparation of chalcogenide alloy compositions which comprises providing a chalcogenide alloy, admixing therewith crystalline or amorphous selenium, and subsequently subjecting the resulting mixture to evaporation.

U.S. Pat. No. 5,030,477 (Badesha) discloses a process for the preparation of chalcogenide alloy compositions which comprises providing a chalcogenide alloy, admixing therewith a metal oxide, and subsequently subjecting the resulting mixture to evaporation.

U.S. Pat. No. 5,002,734 (Kowalczyk et al.), discloses a process for the preparation of chalcogenide alloys which comprises crystallizing a chalcogenide alloy source component, grinding and pelletizing the crystallized alloy product, and evaporating the alloy onto a supporting substrate.

Difficulties continue to be encountered in achieving precise control of tellurium and/or arsenic fractionation in the outer surface of a vacuum deposited photoconductive layer. This, in turn, affects the physical or electrical properties of the final photoreceptor. Photoreceptors containing large batch to batch top surface tellurium or arsenic concentrations tend to exhibit correspondingly large batch to batch variations in physical or electrical properties, which is unacceptable in high speed precision copiers, duplicators and printers because of copy quality variations. Moreover, variations in physical or electrical properties as a photoreceptor surface wears away during cycling is unacceptable in high speed precision copiers, duplicators, and printers, particularly during long length runs where, for example, the copy quality should be uniform from the first copy to thousands of copies. High speed copiers, duplicators and printers are constrained by narrow operating windows that require photoreceptors having precise, predictable operating characteristics from one batch to the next and during cycling.

Thus, there is a need for an improved process for preparing photoreceptors comprising selenium alloys containing additives such as tellurium and/or arsenic.

SUMMARY OF THE INVENTION

It is an object of the present invention to provide an improved process for preparing selenium alloy materials for electrophotographic imaging members which overcomes the the above-noted disadvantages.

It is another object of the present invention to provide an improved process which controls the relative quantity of tellurium formed in the top surface layer of vacuum deposited selenium alloys containing tellurium.

It is yet another object of the present invention to provide an improved process which maintains batch to batch top surface tellurium concentrations in the top surface layer of vacuum deposited selenium alloys containing tellurium.

It is a further object of the present invention to provide an improved process which controls tellurium fractionation within narrower limits.

Another object of the present invention is to provide an improved process which controls arsenic fractionation within narrower limits.

Yet another object of the present invention is to provide an improved process which controls the sensitivity of photoreceptors to light within narrower limits.

Still another object of the present invention is to provide an improved process which increases photoreceptor fabrication yields.

It is another object of the present invention to provide an improved process which reduces the level of tellurium fractionation.

It is yet another object of the present invention to provide an improved process which reduces the level of arsenic fractionation.

It is still another object of the present invention to provide an improved process which reduces the tellurium distribution variation through the thickness of a selenium-tellurium alloy photoconductive layer.

It is a further object of the present invention to provide an improved process which reduces the arsenic distribution variation through the thickness of a selenium-arsenic alloy photoconductive layer.

Another object of the present invention is to provide an improved process which controls the electrical cycling characteristics within narrower limits.

Yet another object of the present invention is to provide an improved process which controls the mechanical wear characteristics of the photoreceptor surface within narrower limits.

Still another object of the present invention is to provide an improved process which limits the loss of selenium rich species early in the evaporation process.

It is another object of the present invention to provide an improved process which allows the achievement of TSA and TST values within narrower predefined limits.

It is yet another object of the present invention to provide an improved process which produces evaporated films of selenium and its alloys with arsenic and/or tellurium which have superior photoconductive properties.

It is still another object of the present invention to provide an improved process which produces photoconducting devices which provide improved image quality when used in electroxerographic applications.

These and other objects of the present invention can be achieved by providing a process which comprises (1) heating particles of an alloy of selenium and an alloying component selected from the group consisting of tellurium, arsenic, and mixtures thereof while said particles are exposed to oxygen; (2) exposing the particles to water; and (3) subjecting the particles previously exposed to oxygen and water to a vacuum. Another embodiment of the present invention is directed to a process which comprises (1) providing particles of an alloy of selenium and an alloying component selected from the group consisting of tellurium, arsenic, and mixtures thereof; (2) forming selenium oxide on the surfaces of the particles; (3) converting the selenium oxide on the particle surfaces to selenious acid; and (4) removing the selenious acid from the particle surfaces. The present invention enables reduced fractionation of selenium and the alloying component during vacuum evaporation of the selenium alloy particles that have been subjected to the process. The resulting alloy particles in powder, shot, or pellet form can be rapidly heated in a vacuum chamber to vacuum deposit the alloy onto a substrate, thereby forming an imaging member with reduced alloy fractionation. Thus, another embodiment of the present invention resides in a process which comprises (1) heating particles of an alloy of selenium and an alloying component selected from the group consisting of tellurium, arsenic, and mixtures thereof while said particles are exposed to oxygen; (2) exposing the particles to water; and (3) subjecting the alloy particles previously exposed to oxygen and water to a vacuum and vacuum evaporating the alloy onto a substrate.

The substrate of the imaging members of the present invention has an electrically conductive surface and is of an effective thickness, generally up to about 100 mils, and preferably from about 1 to about 50 mils, although the thickness can be outside of this range. The substrate can be opaque or substantially transparent and can comprise numerous suitable materials having the desired mechanical properties. The entire substrate can comprise the same material as that in the electrically conductive surface or the electrically conductive surface can merely be a coating on the substrate. Any suitable electrically conductive material can be employed. Typical electrically conductive materials include aluminum, titanium, nickel, chromium, brass, stainless steel, copper, zinc, silver, tin, and the like. The conductive layer can vary in thickness over substantially wide ranges depending on the desired use of the electrophotoconductive member. Generally, the conductive layer ranges in thickness from about 50 Angstroms to many centimeters, although the thickness can be outside of this range. When a flexible electrophotographic imaging member is desired, the thickness typically is from about 100 Angstroms to about 750 Angstroms. The substrate can be of any other conventional material, including organic and inorganic materials. Typical substrate materials include insulating nonconducting materials such as various resins known for this purpose including polyesters, polycarbonates, polyamides, polyurethanes, and the like. The coated or uncoated substrate can be flexible or rigid, and can have any number of configurations, such as a plate, a cylindrical drum, a scroll, an endless flexible belt, or the like. The outer surface of the supporting substrate preferably comprises a metal oxide such as aluminum oxide, nickel oxide, titanium oxide, and the like.

In some cases, intermediate adhesive layers between the substrate and subsequently applied layers may be desirable to improve adhesion. If such adhesive layers are utilized, they preferably have a dry thickness of from about 0.1 micron to about 5 microns, although the thickness can be outside of this range. Typical adhesive layers include film-forming polymers such as polyester, polyvinylbutyral, polyvinylpyrrolidone, polycarbonate, polyurethane, polymethylmethacrylate, and the like as well as mixtures thereof. Since the surface of the supporting substrate can be a metal oxide layer or an adhesive layer, the expression "supporting substrate" as employed herein is intended to include a metal oxide layer with or without an adhesive layer on a metal oxide layer.

Any suitable photoconductive chalcogenide alloy including binary, tertiary, quaternary, and the like alloys can be employed in effective amounts. For example, from about 40 grams to about 55 grams of alloy is typically an effective amount when preparing a 50 to 55 microns thick 4 inch by 6 inch alloy thin film to form a vacuum deposited photoconductive layer. Preferred alloys include alloys of selenium with tellurium, arsenic, or tellurium and arsenic with or without a halogen dopant. Typical photoconductive alloys of selenium include selenium-tellurium, selenium-arsenic, selenium-tellurium-arsenic, selenium-tellurium-chlorine, selenium-arsenic-chlorine, selenium-tellurium-arsenic-chlorine alloys, and the like. Photoconductive alloys of selenium are to be distinguished from stoichiometric compounds of selenium such as arsenic triselenide ($As_2Se_3$). Stoichiometric compounds of selenium such as arsenic triselenide appear to present less of a fractionation problem compared to alloys of selenium such as alloys of selenium and tellurium. As employed herein, a selenium alloy is defined as an intermetallic compound of selenium with other elemental additives where the ratios of constituents are inconsistent with stoichiometric compositions. The photoconductive alloys of selenium can be applied to a coated or uncoated substrate alone as the only photoconductive layer or they can be used in conjunction with one or more other layers such as a selenium or selenium alloy transport layer and/or a protective overcoat layer. Generally, the selenium-tellurium alloy can comprise from about 5 percent by weight to about 40 percent by weight tellurium and a halogen selected from the group consisting of up to about 70 parts per million by weight of chlorine and up to about 140 parts per million by weight of iodine all based on the total weight of the alloy with the remainder being selenium, although all of these amounts can be outside of the stated ranges. The selenium-arsenic alloy can comprise from about 0.01 percent by weight to about 35 percent by weight arsenic and a halogen selected from the group consisting of up to about 200 parts per million by weight of chlorine and up to about 1,000 parts per million by weight of iodine all based on the total weight of the alloy with the remainder being selenium, although all of these amounts can be outside of the stated ranges. The selenium-tellurium-arsenic alloy can comprise from about 5 percent by weight to about 40 percent by weight of tellurium, from about 0.1 percent by weight to about 5 percent by weight of arsenic, and a halogen selected from the group consisting of up to about 200 parts per million by weight of chlorine and up to about 1,000 parts per million by weight of iodine all based on the total weight of the alloy with the remainder being selenium, although all of these amounts can be outside of the stated ranges. The expressions "alloy of selenium" and "selenium alloy" are intended to include halogen doped alloys as well as alloys not doped with halogen. Surprisingly, analysis of films coated from pre-crystallized arsenic alloy particles indicated nominal chlorine levels in the vacuum deposited films, so chlorine loss does not appear to be a factor in the pre-crystallization of low arsenic alloy beads. When employed as a single photoconductive layer in an electrophotographic imaging member, the thickness of the photoconductive selenium alloy layer is typically from about 0.1 micron to about 400 microns thick, although the thickness can be outside of this range. Also, dopants can include metals such as thallium, iron, manganese, and the like in place of halogen. The aforementioned dopants are generally present in an amount of from about 10 to about 500 parts per million, and with halogen preferably in an amount of 10 to 200, and preferably about 10 to about 100 parts per million, although the amounts can be outside of these ranges.

Selenium-tellurium and selenium-tellurium-arsenic alloy photoconductive layers are frequently employed as a charge generation layer in combination with a charge transport layer. The charge transport layer is usually positioned between a supporting substrate and the charge generating selenium alloy photoconductive layer. Generally, a selenium-tellurium alloy comprises from about 60 percent by weight to about 95 percent by weight selenium and from about 5 percent by weight to about 40 percent by weight tellurium based on the total weight of the alloy, although the amounts can be outside of these ranges. The selenium-tellurium alloy can also comprise other components such as less than about 35 percent by weight of arsenic to minimize crystallization of the selenium and less than about 1,000 parts per million by weight of halogen. In a more preferred embodiment, the photoconductive charge generating selenium alloy layer comprises from about 5 percent by weight to about 25 percent by weight of tellurium, from about 0.1 percent by weight to about 4 percent by weight of arsenic, and a halogen selected from the group consisting of up to about 100 parts per million by weight of chlorine and up to about 300 parts per million by weight of iodine, with the remainder being selenium. Compositions for optimum results are dictated by the application. It is desirable, in general, to achieve uniformly homogeneous compositions within the evaporated layers and to evaporate the alloy materials without significant fractionation. Elevated levels of tellurium can lead to excessive photoreceptor light sensitivity and high dark decay and correspondingly reduced levels of tellurium can result in low light sensitivity and loss of copy quality. Elevated levels of arsenic, in some applications above about 4 percent by weight, can lead to high dark decay, to problems in cycling stability, and to reticulation of the photoreceptor surface. The resistance of amorphous selenium photoreceptors to thermal crystallization and surface wear can begin to degrade as the concentration of arsenic drops below about 1 percent by weight. As the chlorine content rises above about 70 parts per million by weight chlorine, the photoreceptor can begin to exhibit excessive dark decay.

Any suitable selenium alloy transport layer can be utilized as a transport layer underlying a photoconductive selenium alloy charge generating layer. The charge transport material can, for example, comprise pure selenium, selenium-arsenic alloys, selenium-arsenic-halogen alloys, selenium-halogen, and the like. Preferably, the charge transport layer comprises a halogen doped selenium arsenic alloy. Generally, from about 10 parts by weight per million to about 200 parts by weight per million of halogen is present in a halogen doped selenium charge transport layer, although the amount can be outside of this range. If a halogen doped transport layer free of arsenic is utilized, the halogen content preferably is less than about 20 parts by weight per million. Inclusion of high levels of halogen in a thick halogen doped selenium charge transport layer free of arsenic can lead to excessive dark decay. Imaging members containing high levels of halogen in a thick halogen doped selenium charge transport layer free of arsenic are described, for example, in U.S. Pat. No. 3,635,705; U.S. Pat. No. 3,639,120, and Japanese Patent Publication No. J5 61 42-537, published June 6, 1981, the disclosures of each of which are totally incorporated herein by reference. Generally, halogen doped selenium arsenic alloy charge transport layers comprise from about 99.5 percent by weight to about 99.9 percent by weight of selenium, from about 0.1 percent to about 0.5 percent by weight of arsenic, and from about 10 parts per million by weight to about 200 parts per million by weight of halogen, the latter halogen concentration being a nominal concentration, although all of these amounts can be outside of the stated ranges. The expression "nominal halogen concentration" is defined as the halogen concentration in the alloy evaporated in the crucible. The charge transport layer is of an effective thickness, generally from about 15 microns to about 300 microns and preferably from about 25 microns to about 50 microns because of constraints imposed by the xerographic development system, constraints imposed by carrier transport limitations and for reasons of economics, although the thickness can be outside of these ranges. The expression "halogen materials" is intended to include fluorine, chlorine, bromine, and iodine. Chlorine is the preferred halogen because of the ease of handling and stability of chlorine in a vacuum deposited film (apparently due to lack of out diffusion). Transport layers are well known in the art. Typical transport layers are described, for example, in U.S. Pat. No. 4,609,605 and in U.S. Pat. No. 4,297,424, the disclosures of each of these patents being totally incorporated herein by reference.

If desired, an interface layer can be positioned between the transport layer and the charge generating photoconductive layer. The interface layer material can, for example, consist essentially of selenium and a nominal halogen concentration of from about 50 parts by weight per million to about 2,000 parts by weight per million of halogen material with the remainder comprising selenium. Minor additions of arsenic might be added but are generally relatively undesirable and may require additional halogen to compensate for this arsenic addition. The halogen concentration in the deposited interface layer will typically be somewhat less than that in the alloy evaporated in the crucible. In order to achieve optimal device properties, the actual halogen content in any final interface layer should normally be greater than about 35 parts by weight per million. Inclusion of high levels of halogen in thick halogen doped selenium layers free of arsenic can lead to excessive dark decay because dark decay is substantially a function of the total halogen in a multilayer imaging member. Imaging members containing high levels of halogen in a thick halogen doped selenium charge transport layer free of arsenic are described, for example, in U.S. Pat. No. 3,635,705, U.S. Pat. No. 3,639,120, and Japanese Patent Publication No. J5 61 42-537, published June 6, 1981, the disclosures of each of which are totally incorporated herein by reference. The use of interface layers is described in, for example, U.S. Pat. No. 4,554,230, the disclosure of which is totally incorporated herein by reference.

Prior to vacuum evaporation of the selenium alloy particles onto the substrate to form an imaging member, the particles are treated to reduce fractionation of the alloy during evaporation. The process of the present invention is believed to alter chemically the surface of the alloy particles, whether in powder form, bead/shot form, pellet form, or the like. This chemical alteration of the surface is believed to result in more uniform evaporation and formation of a vacuum evaporated selenium alloy layer with a more homogeneous chemical profile.

Initially, the alloy particles are subjected to oxidation. It is believed that oxidation results in formation of a selenium oxide ($SeO_2$) rich surface on the particles. The particles are heated in the presence of oxygen at an effective temperature, generally no more than about 100° C. Typically, the heating temperature is from about 25° to about 100° C., preferably from about 25° to about 90° C., and more preferably from about 30° to about 50° C. Exposure to oxygen can be by any suitable means, such as exposure to ambient air conditions during heating, by heating the alloy in a stream of oxygen, or the like. Heating the particles in the presence of oxygen is for an effective period of time, generally from about 15 minutes to about 6 hours and preferably from about 1 hour to about 2 hours. Heating can be for a longer period if desired, although this is generally not necessary. Although not necessary, agitation of the particles during this step may be desirable to maximize particle surface exposure to oxygen and thereby enhance the reaction rate. Heating can be by any suitable means, such as an atmospherically controlled oven or the like.

Subsequent to or while heating in the presence of oxygen, the particles are exposed to water, preferably in vapor form. It is believed that exposure of the particles to water subsequent to or during heating in the presence of oxygen results in formation of a thin layer of selenious acid ($H_2SeO_3$) on the surfaces of the particles. When the particles are exposed to water vapor, the vapor is present in the atmosphere in any effective concentration, generally from about 40 percent relative humidity to about 100 percent relative humidity and preferably from about 40 to about 80 percent relative humidity. Exposure to water is for an effective period of time, generally from about 15 minutes to about 2 hours and preferably for about 1 hour, and is at any effective temperature, typically from about 25° to about 100° C., and preferably from about 30° to about 50° C. Exposure to water can be for a period longer than about 2 hours if desired, although this is generally not necessary. Although not necessary, agitation of the particles during this step may be desirable to maximize particle surface exposure to water and thereby enhance the reaction rate.

Subsequent to exposure to oxygen and water, the particles are exposed to a vacuum. It is believed that exposing the particles having a thin layer of selenious acid to vacuum conditions will remove the layer of selenious acid under vacuum as a result of the vapor pressure of selenious acid, thereby resulting in formation of particles having a thin layer rich in the alloying component or components on the surfaces. For example, when the alloy is a selenium-tellurium alloy, the particles formed will have a thin layer of tellurium rich alloy on the surfaces. When the alloy is a selenium-tellurium-arsenic alloy, the particles formed will have a thin layer of tellurium-arsenic rich alloy on the surfaces. It is believed that subsequent vacuum evaporation of the selenium alloy particles having surfaces rich in the alloying component or components leads to reduced preferential loss of selenium from the particles during the crucible heating stage. By preventing the preferential loss of selenium, it is believed that a homogeneous alloy is present in the crucible for the duration of the vacuum evaporation process, thereby resulting in reduced fractionation and a chemically homogeneous profile in the alloy layer formed. Exposure of the particles to vacuum is for an effective period of time, generally from about 0.5 to about 6 hours, although the exposure to vacuum can be for a longer period if desired. The vacuum conditions applied during this step typically are from about $5 \times 10^{-3}$ mm Hg to about $1 \times 10^{-5}$ mm Hg, although the pressure can be outside of this range. Exposure to vacuum can be at any effective temperature, generally from about 25° to about 450° C., and preferably from about 170° to about 200° C., although the temperature can be outside of this range. Although not necessary, agitation of the particles during this step may be desirable to maximize particle surface exposure to vacuum conditions and thereby enhance the evaporation rate. If desired, the exposure of the particles to vacuum can be combined with the step of vacuum evaporation. Selenium alloy particles that have been heated in the presence of oxygen and exposed to water vapor can subsequently be incorporated into a vacuum coating apparatus. The vacuum conditions applied during the coating operation thus complete the last step of the particle treatment process.

The particles treated by the process of the present invention can in general be in powder, shot (bead), or pellet form. However, the particles can also be in chunk or ingot form if so desired. Generally, to prepare shot (bead) particles, the components of the selenium alloy are combined by melting the selenium and additives together by any suitable conventional technique. The molten selenium alloy is then shotted by any suitable method. Shotting is usually effected by quenching molten droplets of the alloy in a coolant such as water to form large particles of alloy in the form of shot or beads. Shotting processes for forming alloy beads are well known and described, for example, in U.S. Pat. No. 4,414,179 to S. Robinette, the entire disclosure of this patent being incorporated herein by reference. The alloy beads typically have an average particle diameter of, for example, from about 300 microns to about 3,000 microns, although the particle size can be outside of this range. Pellet particles can be prepared from shot particles by grinding shot particles into a powder and thereafter compressing the powder into relatively large pellets. Pelletizing of the amorphous shotted alloy is frequently utilized as a means of controlling fractionation. The free flowing shot or pellets obtained by the multistep process of this invention can be readily weighed out and spread evenly in the crucibles to facilitate more uniform melting of the alloy and evaporation without splattering due to trapped gasses. Material in "chunk" or agglomerated form can present handling and weighing difficulties and difficulty in distributing the material evenly within the crucibles within the vacuum coater.

Where pellets are to be employed, the alloy beads are rapidly ground in a conventional high speed grinder or attritor to form alloy particles typically having an average particle diameter of less than about 200 microns, although the particle size can be higher. Any suitable grinding device can be utilized to pulverize the bead particles to form the fine alloy particles. Typical grinders include hammer mills, jet pulverizers, disk mills, and the like. Depending upon the efficiency of the grinding device employed, grinding alloy beads to form alloy particles can normally be accomplished in less than about 5 minutes. Longer grinding times can be employed, if desired.

After grinding, the fine alloy particles are compressed by any suitable technique into large particles of alloy usually referred to as pellets typically having an average weight of from about 50 milligrams to about 1,000 milligrams, although the weight can be outside of this range. A pellet weight greater than about 50 milligrams is generally preferred for ease of handling. When the pellet weight exceeds about 1,000 milligrams, evaporation discontinuities may be observed. The pellets can be of any suitable shape. Typical shapes include cylinders, spheres, cubes, tablets, and the like. Compression of the alloy particles into pellets can be accomplished with any suitable device such as, for example, a simple punch tableting press, a multi-punch rotary tableting press, or the like.

The alloy prepared by the process of this invention can be deposited by any suitable conventional technique, such as vacuum evaporation. The specific conditions vary depending upon the proportions of components in the different selenium alloy materials utilized. Typical temperature ranges for vacuum deposition are from about 300° C. to about 350° C. for alloys of Se-Te, from about 250° C. to about 350° C. for alloys of Se-As, and from about 300° C. to about 350° C. for alloys of Se-As-Te at a vacuum of between about $5 \times 10^{-4}$ torr and about $8 \times 10^{-5}$ torr for from about 10 minutes to about 25 minutes, although all of these values can be outside of the stated ranges. It is generally preferred that the substrate temperature be maintained in the range of from about 60° C. to about 85° C. during deposition.

When the selenium alloy deposited onto a substrate in the process of the present invention is the only photoconductive layer in the final imaging member, the selenium alloy can be vacuum deposited in a conventional manner except that the temperature profile used preferably rapidly ramps from a low temperature to a higher temperature, with final evaporation preferably being conducted as quickly as possible without splattering. Splattering causes surface defects. Steep temperature ramping further prevents selenium rich species from coming off first from the crucibles which, in turn, minimizes fractionation. The ramp profile depends upon whether the selenium alloy contains Te, As, or As and Te. Thus, the final evaporation is preferably conducted at the highest possible temperature without splattering. Typical temperature ranges for ramp heating are from an initial temperature of 20° C. to final temperature of 385° C. for alloys of Se-Te; an initial temperature of about 20° C. to a final temperature of about 450° C. for alloys of Se-As; and an initial temperature of about 20° C. to a final temperature of about 385° C. for alloys of Se-As-Te.

The first layer of multiple layered photoreceptors, such as a transport layer, can be deposited by any suitable conventional technique, such as vacuum evaporation. Thus, a transport layer comprising a halogen doped selenium-arsenic alloy comprising less than about 1 percent arsenic by weight can be evaporated by conventional vacuum coating devices to form the desired thickness. The amount of alloy to be employed in the evaporation boats of the vacuum coater will depend on the specific coater configuration and other process variables to achieve the desired transport layer thickness. Chamber pressure during evaporation can be on the order of about $4 \times 10^{-5}$ torr. Evaporation is normally completed in about 15 to 25 minutes with the molten alloy temperature ranging from about 250° C. to about 325° C. Other times and temperatures and pressures outside these ranges can be used as well understood by those skilled in the art. It is generally preferred that the substrate temperature be maintained in the range of from about 50° C. to about 70° C. during deposition of the transport layer. Additional details for the preparation of transport layers are disclosed, for example, in U.S. Pat. No. 4,297,424, the disclosure of which is totally incorporated herein by reference.

Steep temperature ramp heating is desirable for every type of selenium alloy evaporation. Thus, for imaging members where the Se-Te alloy is in the last layer, a temperature ramp from 130° C. to about 385° C. in a period of about 15 minutes is typical. Generally, depending on the specific alloy composition employed, the final temperature ranges from about 300° C. to about 450° C. for Se-Te alloys.

The imaging members prepared by the process of the present invention can be selected for known imaging and printing processes as disclosed in, for example, U.S. Pat. No. 4,265,990, U.S. Pat. No. 4,544,618, U.S. Pat. No. 4,560,635, and U.S. Pat. No. 4,298,672, the disclosures of each of which are totally incorporated herein by reference.

Specific embodiments of the invention will now be described in detail. These examples are intended to be illustrative, and the invention is not limited to the materials, conditions, or process parameters set forth in these embodiments. All parts and percentages are by weight unless otherwise indicated.

EXAMPLE I

An alloy comprising about 89 percent by weight selenium and about 11 percent by weight tellurium in shot form (prepared by quenching droplets of the molten alloy) with an average particle size of 2,200 microns was placed on a Pyrex ® glass tray and inserted into a Blue M Model POM-203C-1 oven. About 100 grams of the alloy shots were spread out uniformly over the area of the tray to maximize bead to bead contact. Oxygen flow into the oven was started at a rate of 5,000 cubic centimeters per minute. The temperature in the oven was raised from ambient temperature to about 40° C. and maintained at this temperature for a period of 2 hours. After the two hours at 40° C., the gas flow of oxygen was changed to air with about 50 percent relative humidity for about 1 hour while maintaining the temperature at 40° C. The surfaces of the alloy shots were acidic subsequent to exposure to water, as determined by contacting the particle surfaces with litmus paper. It is believed that the acidity can be attributed to the formation of selenious acid on the particle surfaces. Subsequently, the alloy shots were placed into a bell jar coater which was then sealed and pumped down to a vacuum of about $1 \times 10^{-3}$ mm Hg at a temperature of 150° C. for one hour. Subsequent to the time under vacuum, air was bled into the coater while cooling it down to ambient temperature, and thereafter the alloy shots were removed from the apparatus.

EXAMPLE II

An alloy comprising about 89 percent by weight of selenium and about 11 percent by weight of tellurium in shot form (prepared by quenching droplets of the molten alloy) with an average particle size of 2,200 microns was rapidly ground over a period of about 5 minutes into a fine powder having an average particle size of about 30 microns in a hammer mill grinder (Paudel Grinder, Model 2A, Fuji Industries, Japan). About 50 grams of the ground alloy was spread evenly on a Pyrex ® glass tray and inserted into a Blue M Model POM-203C-1 oven. Oxygen flow into the oven was started at a rate of 5,000 cubic centimeters per minute. The temperature in the oven was raised from ambient temperature to about 40° C. and maintained at this temperature for a period of 2 hours. After the 2 hours at 40° C., the gas flow of oxygen was changed to air with about 50 percent relative humidity for about 1 hour while maintaining the temperature at 40° C. During the time the powder was in the oven, a Pyrex ® rod was used to agitate slightly the fine particles about every 30 minutes to ensure maximum exposure of the alloy particle surfaces to the atmosphere within the oven. The surfaces of the alloy particles were acidic subsequent to exposure to water, as determined by contacting the particle surfaces with litmus paper. It is believed that the acidity can be attributed to the formation of selenious acid on the particle surfaces. The alloy powder was subsequently placed into a bell jar coater which was then sealed and pumped down to a vacuum of about $1 \times 10^{-3}$ mm Hg at a temperature of 150° C. for one hour. Subsequent to the time under vacuum, air was bled into the coater while cooling it down to ambient temperature, and thereafter the alloy shots were removed from the apparatus.

EXAMPLE III

An alloy comprising about 89 percent by weight of selenium and about 11 percent by weight of tellurium in shot form (prepared by quenching droplets of the molten alloy) with an average particle size of 2,200 microns was rapidly ground over a period of about 5 minutes into a fine powder having an average particle size of about 30 microns in a hammer mill grinder (Paudel Grinder, Model 2A, Fuji Industries, Japan). The ground alloy powder was then compressed into pellets having an average weight of about 300 milligrams in a pelletizer (Hata Pelletizer, Model HPT-22A, Hata Iron Works, Japan). Compression pressure in the pelletizer was about 15,000 killigrams per square centimeter and the pellets had a length of about 3 millimeters and a diameter of about 6 millimeters. About 50 grams of the pelletized alloy was spread evenly on a Pyrex ® glass tray and inserted into a Blue M Model POM-203C-1 oven. Oxygen flow into the oven was started at a rate of 5,000 cubic centimeters per minute. The temperature in the oven was raised from ambient temperature to about 40° C. and maintained at this temperature for a period of 2 hours. After the 2 hours at 40° C., the gas flow of oxygen was changed to air with about 50 percent relative humidity for about 1 hour while maintaining the temperature at 40° C. The surfaces of the alloy pellets were acidic subsequent to exposure to water, as determined by contacting the particle surfaces with litmus paper. It is believed that the acidity can be attributed to the formation of selenious acid on the particle surfaces. The alloy pellets were subsequently placed into a bell jar coater which was then sealed and pumped down to a vacuum of about $1 \times 10^{-3}$ mm Hg at a temperature of 150° C. for one hour. Subsequent to the time under vacuum, air was bled into the coater while cooling it down to ambient temperature, and thereafter the alloy shots were removed from the apparatus.

EXAMPLE IV

An imaging member is prepared as follows. The shots of selenium-tellurium alloy described in Example I are exposed to heat and oxygen, followed by exposure to water as described in Example I. Subsequently, the shots are placed in stainless steel crucibles and incorporated into a vacuum evaporation chamber containing an aluminum substrate. The alloy is evaporated onto the substrate at an evaporation temperature of from about 280° C. and about 350° C. and at an evaporation pressure of from about $4 \times 10^{-4}$ mm Hg and about $2 \times 10^{-5}$ mm Hg while the substrate is maintained at a temperature of from about 55° to about 85° C. As a result of this process, an imaging member comprising an aluminum substrate and a selenium-tellurium alloy photogenerator layer is formed. It is believed that the imaging member will exhibit reduced fractionation in that the selenium-tellurium alloy situated at the photogenerator layer surface will contain no more than about 12 percent by weight of tellurium. In addition, it is believed that the photosensitivity will be improved (i.e., will not be excessively high, in that excessive photosensitivity tends to occur with increased tellurium concentration). The photosensitivity of the imaging member at 560 nanometers wavelength is approximately equivalent to 35 sensitivity units (volts per ergs-square centimeters, V/[erg-cm$^2$]) per 1 percent tellurium at the top surface of the member; thus, the expected photosensitivity is believed to be about 420 sensitivity units (V/[erg-cm$^2$]). Further, it is believed that the imaging member will exhibit enhanced copy image quality.

For comparison purposes, a second imaging member is prepared by the same process except that the alloy shots are not heated in the presence of oxygen or exposed to water prior to vacuum evaporation. It is believed that the resulting imaging member comprising an aluminum substrate and alloy photogenerator layer will exhibit increased fractionation compared to the member prepared with shots prepared as described in Example I in that the selenium-tellurium alloy situated at the photogenerator layer surface will contain at least about 13 percent by weight of tellurium. In addition, it is believed that the photosensitivity will be excessively high compared to that of the member prepared with shots prepared as described in Example I, resulting in production of excessively dark copies; the expected photosensitivity is believed to be about 455 sensitivity units (V/[erg-cm$^2$]), or about 35 sensitivity units greater than that obtained for the member prepared with shots prepared as described in Example I. Further, it is believed that the imaging member will exhibit reduced copy image quality compared to the member prepared with shots prepared as described in Example I.

EXAMPLE V

An imaging member is prepared as follows. The selenium-tellurium alloy powder described in Example II is exposed to heat and oxygen, followed by exposure to water as described in Example II. Subsequently, the powder is placed in stainless steel crucibles and incorporated into a vacuum evaporation chamber containing an aluminum substrate. The alloy is evaporated onto the substrate at an evaporation temperature of from about 280° C. and about 350° C. and at an evaporation pressure of from about $4 \times 10^{-4}$ mm Hg and about $2 \times 10^{-5}$ mm Hg while the substrate is maintained at a temperature of from about 55° to about 85° C. As a result of this process, an imaging member comprising an aluminum substrate and a selenium-tellurium alloy photogenerator layer is formed. It is believed that the imaging member will exhibit reduced fractionation in that the selenium-tellurium alloy situated at the photogenerator layer surface will contain no more than about 12 percent by weight tellurium. In addition, it is believed that the photosensitivity will be improved (i.e., will not be excessively high, in that excessive photosensitivity tends to occur with increased tellurium concentration). The photosensitivity of the imaging member at 560 nanometers wavelength is approximately equivalent to 35 sensitivity units (volts per ergs-square centimeters, V/[erg-cm$^2$]) per 1 percent tellurium at the top surface of the member; thus, the expected photosensitivity is believed to be about 420 sensitivity units (V/[erg-cm$^2$]). Further, it is believed that the imaging member will exhibit enhanced copy image quality.

For comparison purposes, a second imaging member is prepared by the same process except that the alloy powder is not heated in the presence of oxygen or exposed to water prior to vacuum evaporation. It is believed that the resulting imaging member comprising an aluminum substrate and alloy photogenerator layer will exhibit increased fractionation compared to the member prepared with shots prepared as described in Example II in that the selenium-tellurium alloy situated at the photogenerator layer surface will contain at least about 13 percent by weight of tellurium. In addition, it is believed that the photosensitivity will be excessively high compared to that of the member prepared with shots prepared as described in Example II, resulting in production of excessively dark copies; the expected photosensitivity is believed to be about 455 sensitivity units (V/[erg-cm$^2$]), or about 35 sensitivity units than that obtained for the member prepared with shots prepared as described in Example II. Further, it is believed that the imaging member will exhibit reduced copy image quality compared to the member prepared with shots prepared as described in Example I.

EXAMPLE VI

An imaging member is prepared as follows. The selenium-tellurium alloy pellets described in Example III are exposed to heat and oxygen, followed by exposure to water as described in Example III. Subsequently, the pellets are placed in stainless steel crucibles and incorporated into a vacuum evaporation chamber containing an aluminum substrate. The alloy is evaporated onto the substrate at an evaporation temperature of from about 280° C. and about 350° C. and at an evaporation pressure of from about $4 \times 10^{-4}$ mm Hg and about $2 \times 10^{-5}$ mm Hg while the substrate is maintained at a temperature of from about 55° to about 85° C. As a result of this process, an imaging member comprising an aluminum substrate and a selenium-tellurium alloy photogenerator layer is formed. It is believed that the imaging member will exhibit reduced fractionation in that the selenium-tellurium alloy situated at the photogenerator layer surface will contain no more than about 12 percent by weight tellurium. In addition, it is believed that the photosensitivity will be improved. The photosensitivity of the imaging member at 560 nanometers wavelength is approximately equivalent to 35 sensitivity units (volts per ergs-square centimeters, V/[erg-cm$^2$]) per 1 percent tellurium at the top surface of the member; thus, the expected photosensitivity is believed to be about 420 sensitivity units (V/[erg-cm$^2$]). Further, it is believed that the imaging member will exhibit enhanced copy image quality.

For comparison purposes, a second imaging member is prepared by the same process except that the alloy pellets are not heated in the presence of oxygen or exposed to water prior to vacuum evaporation. It is believed that the resulting imaging member comprising an aluminum substrate and alloy photogenerator layer will exhibit increased fractionation compared to the member prepared with shots prepared as described in Example III in that the selenium-tellurium alloy situated at the photogenerator layer surface will contain at least about 13 percent by weight of tellurium. In addition, it is believed that the photosensitivity will be excessively high compared to that of the member prepared with shots prepared as described in Example III, resulting in production of excessively dark copies; the expected photosensitivity is believed to be about 455 sensitivity units (V/[erg-cm$^2$]), or about 35 sensitivity units greater than that obtained for the member prepared with shots prepared as described in Example III. Further, it is believed that the imaging member will exhibit reduced copy image quality compared to the member prepared with shots prepared as described in Example III.

EXAMPLE VII

An imaging member is prepared as described in Example VI with the exception that the alloy comprises about 99.5 percent by weight of selenium and about 0.5 percent by weight of arsenic and is doped with about 10 ppm chlorine. It is believed that the imaging member thus formed will exhibit reduced fractionation, improved photosensitivity, and improved copy quality.

For comparison purposes, a second imaging member is prepared by the same process except that the selenium-arsenic alloy pellets are not heated in the presence of oxygen or exposed to water prior to vacuum evaporation. It is believed that the resulting imaging member comprising an aluminum substrate and alloy photogenerator layer will exhibit increased fractionation, reduced photosensitivity, and reduced copy quality compared to the member prepared with the alloy processed according to the present invention.

EXAMPLE VIII

An imaging member is prepared as described in Example VI with the exception that the alloy comprises about 88 percent by weight of selenium, about 11 percent by weight of tellurium, and about 1 percent by weight arsenic and is doped with about 20 ppm of chlorine. It is believed that the imaging member thus formed will exhibit reduced fractionation, improved photosensitivity, and improved copy quality.

For comparison purposes, a second imaging member is prepared by the same process except that the selenium-tellurium-arsenic alloy pellets are not heated in the presence of oxygen or exposed to water prior to vacuum evaporation. It is believed that the resulting imaging member comprising an aluminum substrate and alloy photogenerator layer will exhibit increased fractionation, reduced photosensitivity, and reduced copy quality compared to the member prepared with the alloy processed according to the present invention.

EXAMPLE IX

An alloy comprising about 88.7 percent by weight of selenium and about 11.3 percent by weight of tellurium in shot form (prepared by quenching droplets of the molten alloy) with an average particle size of 2,200 microns was rapidly ground over a period of about 5 minutes into a fine powder having an average particle size of about 30 microns in a hammer mill grinder (Paudel Grinder, Model 2A, Fuji Industries, Japan). The ground alloy powder was then compressed into pellets having an average weight of about 300 milligrams in a pelletizer (Hata Pelletizer, Model HPT-22A, Hata Iron Works, Japan). Compression pressure in the pelletizer was about 15,000 killigrams per square centimeter and the pellets had a length of about 3 millimeters and a diameter of about 6 millimeters. Subsequently, some of the pellets were reground to form a powder of the alloy while other pellets were allowed to remain intact. The intact pellets were then placed in a dessicator containing room air and with water in the bottom, and the dessicator was then sealed and heated to about 100° C. for 24 hours, thereby creating a steam atmosphere within the dessicator. The surfaces of the alloy pellets werre acidic (pH about 6) subsequent to the oxygen/heat/water treatment, as determined by contacting the particle surfaces with litmus paper. It is believed that the acidity can be attributed to the formation of selenious acid on the particle surfaces.

One of the alloy pellets was then placed under vacuum and the pellet surface was analyzed by Electron Spectroscopy for Chemical Analysis (ESCA). The results of the ESCA analysis indicated that the surface of the pellet comprised about 12.5 percent by weight of tellurium and about 87.5 percent by weight of selenium. No oxides of selenium or tellurium were detected during the analysis. These results indicate that the alloy treatment process of the present invention results in formation of alloy particles with a tellurium-rich surface. It is believed that selenious acid was formed on the particle surface and was removed upon being subjected to vacuum during ESCA analysis, leaving behind a tellurium-rich skin on the pellet surface.

The powder formed by grinding the pelletized alloy was then placed in a dessicator containing room air and with water in the bottom, and the dessicator was then sealed and heated to about 100° C. for 24 hours, thereby creating a steam atmosphere within the dessicator. The surfaces of the alloy powder particles were acidic (pH about 6) subsequent to the oxygen/heat/water treatment, as determined by contacting the particle surfaces with litmus paper. It is believed that the acidity can be attributed to the formation of selenious acid on the particle surfaces.

The alloy powder was then placed under vacuum and the particle surfaces were analyzed by Electron Spectroscopy for Chemical Analysis (ESCA). The results of the ESCA analysis indicated that the surface of the powder particles comprised about 14.7 percent by weight of tellurium and about 85.3 percent by weight of selenium. No oxides of selenium or tellurium were detected during the analysis. These results further indicate that the alloy treatment process of the present invention results in formation of alloy particles with a tellurium-rich surface. It is believed that selenious acid was formed on the particle surface and was removed upon being subjected to vacuum during ESCA analysis, leaving behind a tellurium-rich skin on the pellet surface. In addition, it is believed that the powder particles exhibited a greater degree of tellurium enrichment than the pellets because the powder sample exposed greater surface area to the X-ray beam.

Other embodiments and modifications of the present invention may occur to those skilled in the art subsequent to a review of the information presented herein; these embodiments and modifications, as well as equivalents thereof, are also included within the scope of this invention.

What is claimed is:

1. A process for forming an imaging member which comprises (1) heating particles of an alloy of selenium and an alloying component selected from the group consisting of tellurium, arsenic, and mixtures thereof while said particles are exposed to oxygen; (2) exposing the particles to water; and (3) subjecting the alloy particles previously exposed to oxygen and water to a vacuum and vacuum evaporating the alloy onto a substrate.

2. A process which comprises (1) heating particles of an alloy of selenium and an alloying component selected from the group consisting of tellurium, arsenic, and mixtures thereof while said particles are exposed to oxygen; (2) exposing the particles to water; and (3) subjecting the particles previously exposed to oxygen and water vapor to a vacuum.

3. A process according to claim 1 wherein the particles are heated to a temperature of from about 25° to about 100° C.

4. A process according to claim 1 wherein the particles are heated to a temperature of from about 30° to about 50° C.

5. A process according to claim 1 wherein the particles are heated while exposed to ambient air.

6. A process according to claim 1 wherein the particles are heated in a stream of oxygen.

7. A process according to claim 1 wherein the particles are heated for a period of from about 15 minutes to about 6 hours.

8. A process according to claim 1 wherein the particles are exposed to water in the form of water vapor at a relative humidity of from about 40 to about 80 percent.

9. A process according to claim 1 wherein the particles are exposed to water for a period of from about 15 minutes to about 2 hours.

10. A process according to claim 1 wherein the particles are exposed to water at a temperature of from about 25° to about 100° C.

11. A process according to claim 1 wherein the particles are exposed to water at a temperature of from about 30° to about 50° C.

12. A process according to claim 1 wherein the particles are exposed to a vacuum at a pressure of from about $5 \times 10^{-3}$ to about $1 \times 10^{-5}$ mm Hg.

13. A process according to claim 1 wherein the particles are exposed to a vacuum at a temperature of from about 25° to about 450° C.

14. A process according to claim 1 wherein the particles are exposed to a vacuum at a temperature of from about 170° to about 200° C.

15. A process according to claim 1 wherein the particles are exposed to a vacuum for a period of from about 0.5 to about 6 hours.

16. A process according to claim 1 wherein the particles are in powder form.

17. A process according to claim 1 wherein the particles are shots.

18. A process according to claim 1 wherein the particles are pellets.

19. A process according to claim 1 wherein the alloy also contains a halogen dopant.

* * * * *